(12) United States Patent
Ziegler et al.

(10) Patent No.: US 11,187,730 B2
(45) Date of Patent: Nov. 30, 2021

(54) PROBE HEAD, PROBE COUPLER AND PROBE ARRANGEMENT

(71) Applicant: Rohde & Schwarz GmbH & Co. KG, Munich (DE)

(72) Inventors: Andreas Ziegler, Munich (DE); Dirk Gehrke, Freising (DE); Reiner Franke, Velbert (DE); Martin Peschke, Vaterstetten (DE); Roland Krimmer, Germering (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 95 days.

(21) Appl. No.: 16/688,648

(22) Filed: Nov. 19, 2019

(65) Prior Publication Data
US 2021/0148955 A1  May 20, 2021

(51) Int. Cl.
*G01R 15/22* (2006.01)

(52) U.S. Cl.
CPC .................. *G01R 15/22* (2013.01)

(58) Field of Classification Search
CPC .. G01R 1/071; G01R 13/347; G01R 29/0885; G01R 29/14; G01R 31/311; G01R 15/24; G01R 15/241; G01R 15/242; G01R 29/08; G01R 29/10; G01R 29/0814; G01R 31/308; G01R 31/002; G01R 31/2831; G01R 31/30; G01R 33/032; G01R 15/22; G01R 23/07; G01R 31/302; G01R 1/06; G01R 1/07; G01R 31/3025; G01R 31/31707; G01R 31/31718; G01R 31/318505; G01R 31/318511; G01R 1/06744; G01R 31/26; G01R 31/2891; G02F 1/0311; G02F 1/29; G02F 2203/13; G02F 2203/24; G01J 4/00; H03F 3/08; H01L 21/66; H01L 22/20; H01L 22/34; H01L 22/12; H01L 22/14; G01Q 30/02
See application file for complete search history.

(56) References Cited

U.S. PATENT DOCUMENTS

| 5,412,330 A  *  | 5/1995 | Ravel ................. G01R 31/308 324/754.23 |
| 5,834,973 A     | 11/1998 | Klatser et al. |
| 5,909,276 A  *  | 6/1999 | Kinney ................. G01N 21/94 356/237.2 |
| 6,288,531 B1 *  | 9/2001 | Ito ........................ G01R 1/071 324/754.06 |
| 6,342,783 B1 *  | 1/2002 | Ito ........................ G01R 1/071 324/754.06 |

(Continued)

FOREIGN PATENT DOCUMENTS

| EP | 722216 B1 | 3/2003 |
| EP | 2909930 B1 | 3/2017 |

*Primary Examiner* — Vinh P Nguyen
(74) *Attorney, Agent, or Firm* — Westman, Champlin & Koehler, P.A.

(57) ABSTRACT

The present invention provides an electrically isolated acquisition of a measurement signal by means of a measurement probe. For this purpose, a probe arrangement is provided with a probe head for electrically measuring a signal. The probe head is coupled to a probe coupler via optical links. In particular, optical links are used for power supply of the probe head and for forwarding optical signals corresponding to the measured electrical signal.

20 Claims, 3 Drawing Sheets

(56) References Cited

U.S. PATENT DOCUMENTS

| | | | |
|---|---|---|---|
| 6,410,906 B1* | 6/2002 | Ito | G01R 1/071 |
| | | | 250/216 |
| 9,319,247 B2* | 4/2016 | Stojakovi | H04L 25/085 |
| 2001/0022338 A1* | 9/2001 | Yanagisawa | G01R 1/071 |
| | | | 250/214 R |
| 2001/0022339 A1* | 9/2001 | Yanagisawa | G01R 15/242 |
| | | | 250/214 R |
| 2015/0215137 A1 | 7/2015 | Stojaković et al. | |

* cited by examiner

PROBE HEAD, PROBE COUPLER AND PROBE ARRANGEMENT

TECHNICAL FIELD

The present invention relates to a probe head, a probe coupler and a probe arrangement. In particular, the present invention relates to a probe head, a probe coupler and a probe arrangement for an electrically isolated acquisition of a measurement signal.

BACKGROUND

Although applicable in principle to an acquisition of a measurement signal for any kind of measurement system, the present invention and its underlying problem will be hereinafter described in combination with measuring a voltage signal.

During development, production or a maintenance of electrical devices it is necessary to measure electrical signals such as a voltage. For this purpose, a probe tip of a measurement system may be electrically connected to a test point for measuring an electrical signal and providing the measured signal to the measurement device, for instance an oscilloscope or the like.

However, in some cases it might be necessary to measure a relative small signal at a relative high reference potential. In particular, if a test signal is measured at a high reference potential, it might be necessary to apply an electrical isolation between the probe tip and the measurement device. In particular, a galvanic isolation may be achieved by means of small transformers.

However, transformers may have a non-linear frequency response. Furthermore, transformers may be not applicable for galvanic isolated transmission of direct current signals. In addition, the use of transformers may require large assembly space in association with a relative high weight.

Against this background, a problem addressed by the present invention is to provide a versatile probe for an electrically isolated measurement of an electrical signal.

SUMMARY

The present invention solves this problem by a probe head, a probe coupler and a probe arrangement with the features of the independent claims. Further advantageous embodiments are subject-matter of the dependent claims.

According to a first aspect, a probe head for an electrically isolated acquisition of a measurement signal is provided. The probe head comprises a probe tip, a first optical interface and a number of one or more second optical interfaces. The probe tip is configured to receive an electrical measurement signal. The optical interface is configured to receive an optical power signal. The first optical interface is further configured to convert the received optical power signal to electrical power. The electrical power provided by the first optical interface is used for a power supply of the probe head. Each of the one or more second optical interfaces is configured to transmit an optical signal based on the electrical measurement signal received by the probe tip.

According to a second aspect, a probe coupler for an electrically isolated acquisition of a measurement signal is provided. The probe coupler comprises a first optical interface, a number of one or more second optical interfaces and an output port. The first optical interface is configured to transmit an optical power signal to a probe head for power supply of the probe head. Each of the one or more second optical interfaces is configured to receive an optical signal from the probe head. In particular, each received optical signal is based on an electrical measurement signal measured by the probe head. The output port provides an electrical output signal. In particular, the electrical output signal is based on the one or more optical signals received by the number of one or more second optical interfaces.

According to a third aspect, a probe arrangement for an electrically isolated acquisition of a measurement signal is provided. The probe arrangement comprises a probe tip, a first optical transmission element, a number of one or more second optical transmission elements and an output port. The probe tip is arranged in the probe head. In particular, the probe tip is configured to measure an electrical measurement signal. The first optical transmission element is configured to transmit an optical power signal from a probe coupler to the probe head. The first optical transmission element is further configured to convert the optical power signal in the probe head to electrical power. The converted electrical power is used for a power supply of the probe head. Each of the second optical transmission elements is configured to transmit an optical signal from the probe head to the probe coupler. In particular, the optical signal of each second optical transmission element is based on the electrical measurement signal received by the probe tip of the probe head. The output port is arranged in the probe coupler. In particular, the output port is configured to provide an electrical output signal based on the one or more optical signals transmitted by the number of one or more second optical transmission elements from the probe head to the probe coupler.

The present invention is based on the finding that measuring electrical signals with a high reference potential may require an electrical isolation between the measuring point and the measurement device. However, the use of transformers for a galvanic isolation may lead to a non-linear frequency response. Furthermore, transformers may be not appropriate for galvanic isolation of direct current signals.

The present invention therefore takes into account this finding and provides a probe arrangement with a probe head and a probe coupler, which are completely electrically isolated by optical links. On the one hand side, optical links can be used for transmitting signals over a wide range of frequencies. In particular, it is possible to transmit low frequency and direct current signals by means of optical links. Further to this, the power supply of the electrically isolated probe head is also performed by means of an optical link. Accordingly, the probe head is completely electrically isolated, and the probe head is only connected with the probe coupler by optical links. In this way, it is possible to achieve a very good isolation between the probe tip and the measurement device, and at the same time a linear transmission of the measurement signals over a wide frequency range can be achieved.

As already mentioned above, the power supply of the probe head is provided by an optical link. For this purpose, a first optical transmission element may receive electrical energy and convert the electrical energy to an optical signal. The optical signal may be forwarded from a first interface of the probe coupler to a first interface of the probe head. The first interface of the probe head may receive the optical signal from the corresponding interface of the probe coupler, and convert the received optical signal to electrical energy. For example, a DC voltage of a predetermined voltage level may be provided for power supply of the probe head. In this way, a power supply of the probe head can be achieved by means of an optical transmission link. Consequently, a galvanic isolation can be even achieved for the power supply of the probe head.

The first interface of the first transmission element may comprise any kind of a light generating element for generating an appropriate optical system. For example, a light emitting diode, in particular a laser diode or the like may be used. However, it is understood, that any other kind of a light generating element may be also possible. Accordingly, the first interface in the probe head may comprise any kind of appropriate element for receiving the optical signal and converting the optical signal to electrical power. For example, an appropriate semiconductor, which can convert light into electrical energy may be used. However, any other kind of element for converting light to electrical energy may be possible, too. Furthermore, the first interface of the probe head may comprise further elements for rectifying or inverting a voltage or converting the voltage to another power level, which is appropriate for providing power to the further elements of the probe head.

The probe tip may be any kind of element, which can be electrically coupled with a desired measurement point. Accordingly, the probe tip can receive an electrical signal and forward the received electrical signal to further components of the probe head. For example, the probe tip may be an electrically conductive tip or any other element, which can receive one or more electrical signals from measurement points of a device under test. The electrical signal received by the probe tip is converted to an optical signal, and the optical signal is transmitted from the respective optical interface of the measurement head to the corresponding optical interface of the probe coupler. For this purpose, any further elements for modifying or adapting the measured signal may be possible. For example, the measured signal may be amplified, attenuated or filtered. Furthermore, it may be even possible to convert a received analogue signal to a digital signal. However, it may be also possible to generate an optical signal having an intensity corresponding to an amplitude of the measured signal.

Further, it may be possible to split the measured signal into two or more signals, wherein each of the signals may related to a specific frequency range. For this purpose, any kind of active or passive filter element may be used. Accordingly, the individual parts of the splitted signal may be transmitted via separate optical channels by means of separate optical transmission elements. For example, a first optical transmission channel may transmit high frequency components relating to a first frequency band. A further optical channel may transmit low frequency components relating to another frequency range. It may be also possible to transmit direct current components via a separate transmission channel. In particular, it may be possible to use any number of transmission channels, wherein each transmission channel relates to an individual frequency range. In particular, the individual frequency ranges may be different, particularly the individual frequency ranges may be adjacent or even overlapping.

The probe coupler may receive the optical signals, which are provided by the probe head based on the measurement signal and generate an electrical signal, which corresponds to the electrical measurement signal received by the probe tip. For this purpose, the one or more optical signals received by the second optical interfaces of the second transmission elements may be combined together in an appropriate manner, and a corresponding electrical signal is generated. In particular, the individual optical signals may be combined together based on their respective frequency ranges. For this purpose, any kind of appropriate device may be possible, which can generate electrical signal based on a received optical signal. For example, the second optical interfaces of the probe coupler may comprise elements such as photosensitive resistors or diodes. However, any other kind of photo sensor or element for converting an optical system to an electrical signal may be possible, too.

According to a possible embodiment, each second optical interface of the probe head is configured to transmit a signal relating to a predetermined bandwidth. In particular, the bandwidth may be different for each second optical interface.

In this way, the frequency response of each optical transmission channel may be adapted to the respective bandwidth. For example, one of the second optical interfaces may be specifically adapted to transmit direct current signals. Further, it may be possible to provide a second optical interface for transmitting low frequency signals. Still a further optical interface may be specifically configured to transmit high frequency components. However, it is understood, that the number of second optical interfaces is not limited to a number of two or three. Furthermore, it may be even possible to use more than three optical interfaces, wherein each optical interface has appropriate bandwidth.

In a possible embodiment, the probe head comprises at least two second optical interfaces. In particular, the at least two optical interfaces may be configured to transmit signals of adjacent or overlapping bandwidth.

Accordingly, by splitting the optical transmission of the signal corresponding to the electrical measurement signal received by the probe tip by a number of two or more transmission channels, each interface for transmitting the respective optical signals may be adapted to the respective frequency range. If necessary or appropriate, the optical signals of at least some frequency ranges may be modulated by an additional modulation signal. In this way, the transmission properties of the optical signals can be further improved.

In a possible embodiment, the probe head comprises a third optical interface. The third optical interface is configured to receive an optical modulation signal. At least one of the number of second interfaces may be configured to transmit a modulated optical signal based on the received modulation signal.

As already explained above, the transmission of some frequency ranges may be further improved by modulating the respective signals. By receiving the required modulation signal for such a modulation, the modulation can be based on a well-known modulation signal, which can be also used for demodulating the signal at the corresponding end, in particular by the probe coupler. In this way, the probe head may easily modulate the optical signal without the need of complex hardware components. Thus, the volume and the weight of the probe head can be reduced.

In a possible embodiment, the probe head comprises a fourth optical interface. The fourth optical interface may be configured to receive an optical control signal. Additionally, or alternatively, the fourth optical interface may transmit an optical control signal. Accordingly, the configuration of the probe head may be controlled based on the received and/or transmitted optical control signals.

In this way, a data communication between the probe head and a further device, for example a probe coupler or the like can be established. Accordingly, the probe head may be provided with appropriate control data for configuring the probe head. For example, a dynamic amplification or attenuation may be controlled, or one or more frequency filters may be configured accordingly. However, it is understood, that the use of the control data is not limited to the above-mentioned examples. Furthermore, any other appropriate control of the probe head may be possible. Furthermore, it may be possible to acquire data of the probe head and to forward the acquired data via an optical control channel to a further device, for example a probe coupler or the like.

In a possible example, the transmission end of the optical transmission elements, i.e. the optical interfaces which transmit optical signals, comprise a laser diode. In particular, the first optical interface of the probe coupler for providing the power signal may comprise a laser diode.

A laser diode may provide an optical signal having high power. If necessary, multiple laser diodes may be used in parallel for achieving the desired power density.

In a possible embodiment, the first optical interface in the probe coupler may be configured to transmit power of at least 500 Milliwatt.

In particular, the first optical interface of the probe coupler may be configured to transmit power of at least 1 Watt, 2 Watt or even 5 Watt or more. The above-mentioned power may relate to the optical power output by the first interface of the probe coupler. Alternatively, the above-mentioned power may be also related to the electrical output power provided by the corresponding first interface of the probe head.

In a possible embodiment of the probe coupler, the probe coupler may comprise a third optical interface for transmitting an optical modulation signal. Accordingly, at least one of the number of second interfaces of the probe head may be configured to output a modulated signal based on the modulation signal provided by the third optical interface of the probe head. Further, the probe coupler may be configured to receive the respective optical signal by the corresponding second optical interface and demodulate the received optical signal based on the modulation signal provided via the third optical interface.

In a possible embodiment, the probe coupler comprises a fourth optical interface. The fourth optical interface may be configured to transmit optical control signals and/or receive optical control signals.

The optical interfaces of the probe head and the optical interfaces of the probe coupler may be connected with each other by means of optical fibers. In particular, a separate optical fiber may be used for connecting each optical interface of the probe head with the corresponding optical interface of the probe coupler.

In a possible embodiment, the optical transmitters, in particular the laser diodes of the transmitting optical interface may be configured to emit an amplitude modulated signal.

In a possible embodiment, the transmitting optical interfaces of the optical transmitting elements may be configured to transmit a pilot signal. The corresponding receiving optical interface may be configured to monitor the pilot signal.

Accordingly, by monitoring the pilot signal, it may be possible to detect a failure or damage in the optical transmission link between the transmitting optical interface and the receiving optical interface. For example, the transmission of the optical power signal may be immediately stopped when a failure in an optical transmission link is detected. Furthermore, it may be possible to evaluate the optical transmission link by monitoring the pilot signal. For example, variations, in particular temperature dependent variations or the like may be detected. Accordingly, the transmission and/or reception properties may be adapted based on the monitoring of the pilot signal.

With the present invention it is therefore possible to provide an improved electrically isolated probe for measuring electrical signals. In particular, a probe head with a probe tip is completely electrically isolated from a further element. In particular, the probe head with the probe tip is only connected with further elements by means of optical links.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

Figure 1:
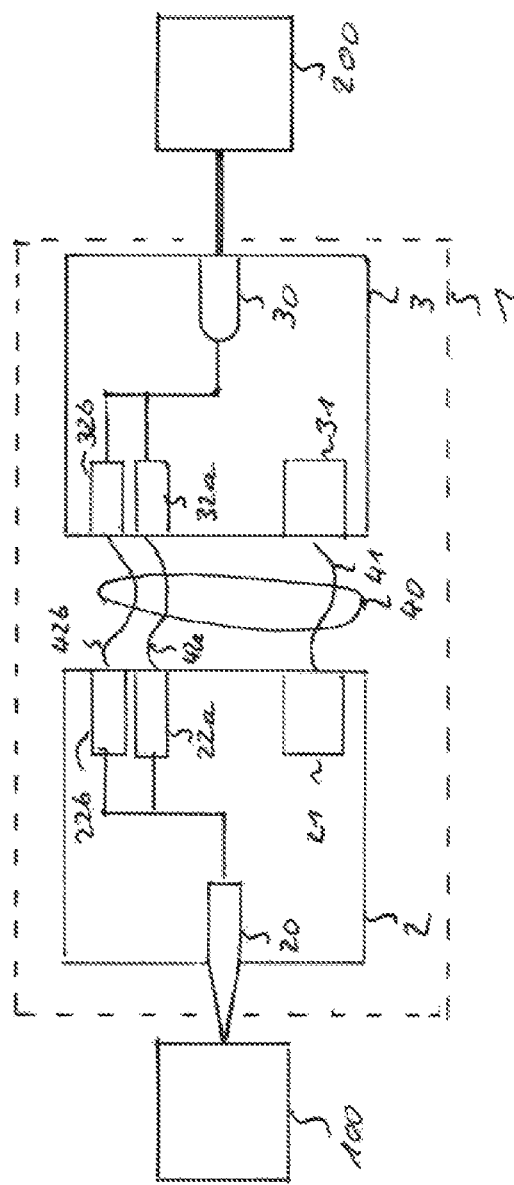
FIG. 1: shows a block diagram of the probe arrangement according to an embodiment.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown in scale.

In the drawings, same, functionally equivalent and identical operating elements, features and components are provided with same reference signs in each case, unless stated otherwise.

DETAILED DESCRIPTION OF THE DRAWINGS

FIG. 1 shows a probe arrangement 1 for an electrical isolated acquisition of a measurement signal. As can be seen in FIG. 1, the probe arrangement 1 comprises a probe head 2 and a probe coupler 3. Probe head 2 and probe coupler 3 may be connected with each other by means of an optical communication link 40 comprising multiple optical fibers 41, 42a, 42b. For example, the optical communication link 40 may have a length of some meters, for example 1 meter or 2 meter. An output port 30 of probe coupler 3 may be electrically connected with a measurement device 200, for example an oscilloscope or the like. However, it is understood, that the measurement device 200 is not limited to an oscilloscope. Moreover, any other kind of measurement device for measuring an electrical signal may be possible, too.

Probe coupler 3 may receive electrical power from an external power source, for example a power source of measurement device 200. However, it may be also possible that the power supply is provided by another external device. The external power may be used for power supply of probe coupler 3. Further to this, the supply power is provided to a first interface 31 of the probe coupler 3. This first optical interface 31 may generate an optical signal and output the optical signal via a first optical link 41 to the corresponding first interface 21 of the probe head 2. Probe head 21 receives the optical signal output by the first interface 31 of probe coupler 3 and converts the received optical signal to electrical power. This electrical power may be used for power supply of the components of probe head 2. In particular, a voltage of the power output by the first interface 21 may be converted to an appropriate voltage, which corresponds to the voltage required for the power supply of probe head 2. In particular, it may be possible to rectify or invert the electrical voltage or to apply any other operation for adapting the voltage accordingly.

Probe head 2 further comprises a probe tip 20. Probe tip 20 may have an electrically conductive tip for receiving an electrical measurement signal. For example, probe tip 20 may be electrically connected with a measuring point of a device under test 100. In this way, probe tip 20 may measure an electrical voltage or any other kind of electrical measurement signal. The received electrical measurement signal may be forwarded to a number of one or more second optical interfaces 22a, 22b. In particular, the second optical interfaces 22a, 22b may output optical signals based on the electrical measurement signal received by probe tip 20. For example, only a single second optical interface 22a or 22b may be used. In this case, the optical output signal provided by the respective second optical interface 22a, 22b may correspond to the electrical measurement signal received by probe tip 20. For example, an amplitude of the optical signal output by the second optical interfaces 22a, 22b may be modulated according to the amplitude of the received measurement signal an intensity of the optical signal may correspond to an amplitude of the received measurement signal.

Furthermore, it may be possible to split a received measurement signal into two or more parts and to transmit a separate optical signal for each part of the splitted electrical measurement signal. For example, the received measurement signal may be splitted into two or more frequency ranges or into a direct current component and an alternating current component.

Figure 2:
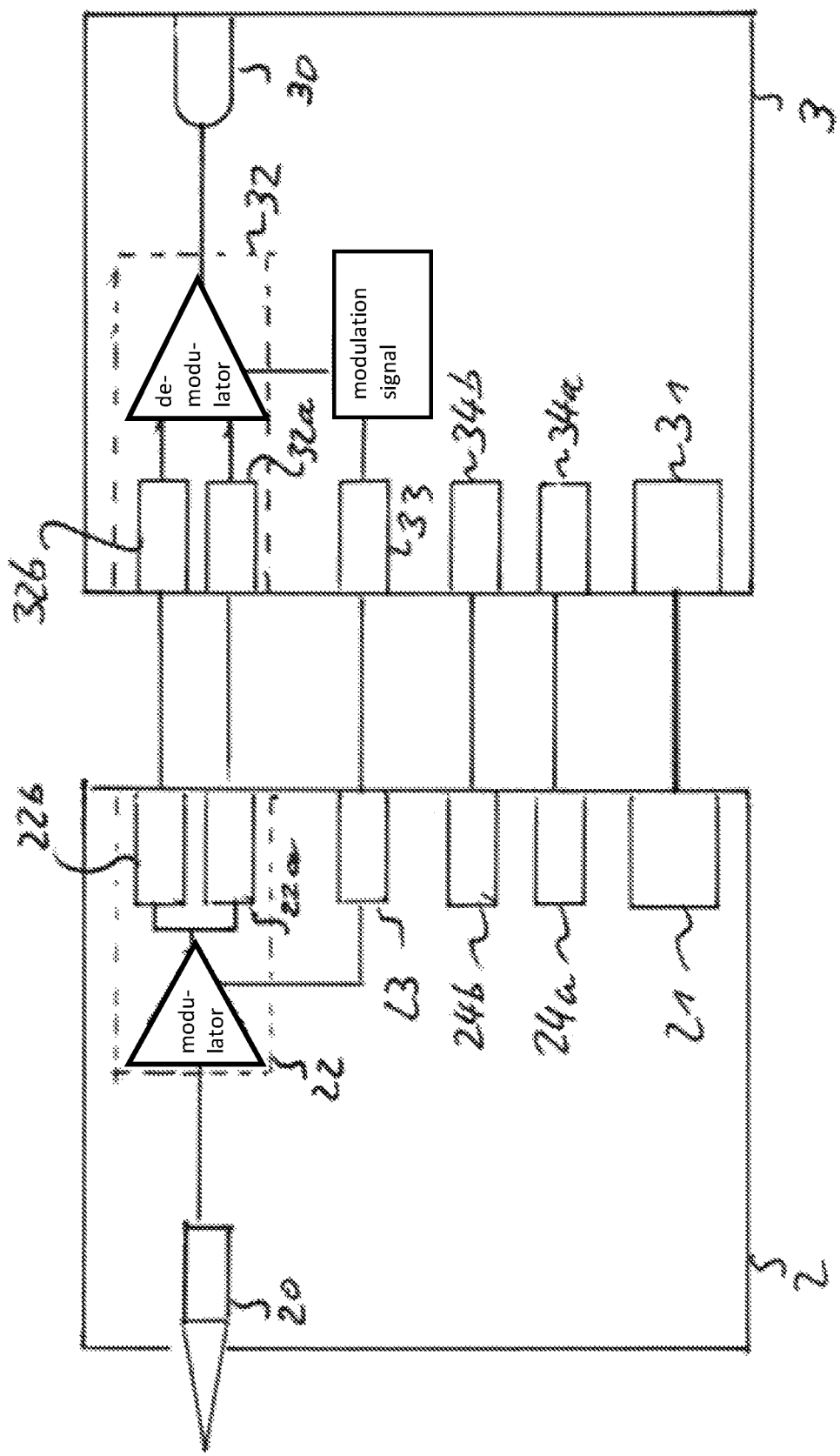
FIG. 2: shows a block diagram of a probe head and the probe coupler according to an embodiment.

Even though, only two second optical interfaces 22a, 22b are illustrated in FIG. 2, it is understood, that the present invention is not limited to only two second optical interfaces. As already mentioned above, it may be also possible to use only a single optical interface 22a, 22b. Furthermore, it may be also possible to use more than two second optical interfaces 22a, 22b.

If two or more second optical interfaces 22a, 22b are used, and consequently, the electrical measurement signal is splitted into two or more parts, each second optical interface 22a, 22b may relate to a predetermined frequency range. In particular, the frequency ranges of the multiple second interfaces 22a, 22b may be different. For example, the frequency ranges may be adjacent, i.e. an ending of a first frequency range may correspond to a beginning of a further frequency range. Furthermore, it may be also possible that the frequency ranges may be overlapping, i.e. an ending of a first frequency range may be higher than a beginning of a further frequency range such that both frequency ranges have an overlapping frequency portion.

The optical signals output by the second optical interfaces 22a, 22b are provided to corresponding second optical interfaces 32a, 32b of the probe coupler 3. For this purpose, the second interfaces 22a, 22b and the corresponding second interfaces 32a, 32b may be coupled via optical fibers 42a, 42b or the like.

The second optical interfaces 32a, 32b receive the optical signals from the corresponding second optical interfaces 22a, 22b of the probe head. Based on the received optical signals, an electrical signal is generated and provided at the output port 30. If the measured signal received by probe tip 20 is split into multiple signals and transmitted via multiple optical links to multiple second optical interfaces 32a, 32b of probe coupler 3, the received multiple optical signals are combined together and a single electrical signal is generated, which corresponds to the combination of the multiple optical signals.

FIG. 2 shows a further embodiment of a probe arrangement 1 for an electrically isolated acquisition of a measurement signal. The probe arrangement 1 according to FIG. 2 comprises all components, which have been already mentioned above in connection with FIG. 1. Thus, the explanation in connection with FIG. 1 fully applies to the embodiment of FIG. 2.

The probe arrangement 1 according to FIG. 2 further comprises additional optical links between the probe head 2 and the probe coupler 3. For example, probe head 3 may generate a modulation signal and forward the generated modulation signal via a third optical interface 33 to the corresponding third optical interface 23 of probe head 2. Accordingly, probe head 2 may receive the modulation signal by the third optical interface 23, and use this modulation signal for modulating the optical signals provided by one or more of the second optical interfaces 22a, 22b. For example, the modulation signal may be used for modulating a direct current component of the received measurement signal, or for modulating a low frequency component of the received measurement signal, while a high frequency component is directly transmitted without modulation.

Probe coupler 3 may receive the modulated optical signal and demodulate the modulated signal based on the same modulation signal, which is provided to probe head 2 via the respective optical link. Even though, only a single optical link for providing a modulation signal is illustrated in FIG. 2, it may be also possible to provide more than one modulation signals via multiple optical links and to apply multiple modulations to a measurement signal, which is splitted into multiple parts.

Furthermore, additional optical links may be provided for exchanging control signals between probe head 2 and probe coupler 3. For example, one or two fourth optical interfaces 24a, 24b may be provided at probe head 2 and corresponding optical interfaces 34a, 34b may be provided probe coupler 3. A first optical link may be used for transmitting control signals from probe coupler 3 to probe head 2, and a second optical link may be used for transmitting control signals from probe head 2 to probe coupler 3. However, it may be also possible to use only a single optical link for a bidirectional communication between probe head 2 and probe coupler 3. In this way, probe coupler 3 may provide control signals to probe head 2 for controlling the operation or the configuration of probe head 2. For example, an amplification, an attenuation, filter frequencies or the like may be set according to the provided control signals. Furthermore, probe head 2 may provide appropriate data via the communication link to probe coupler 3 for providing data related to the operation of probe head 2. However, it is understood, that the communication between probe head 2 and probe coupler 3 is not limited to the above-mentioned examples. Furthermore, control data for any other kind of application may be also possible.

Figure 3:
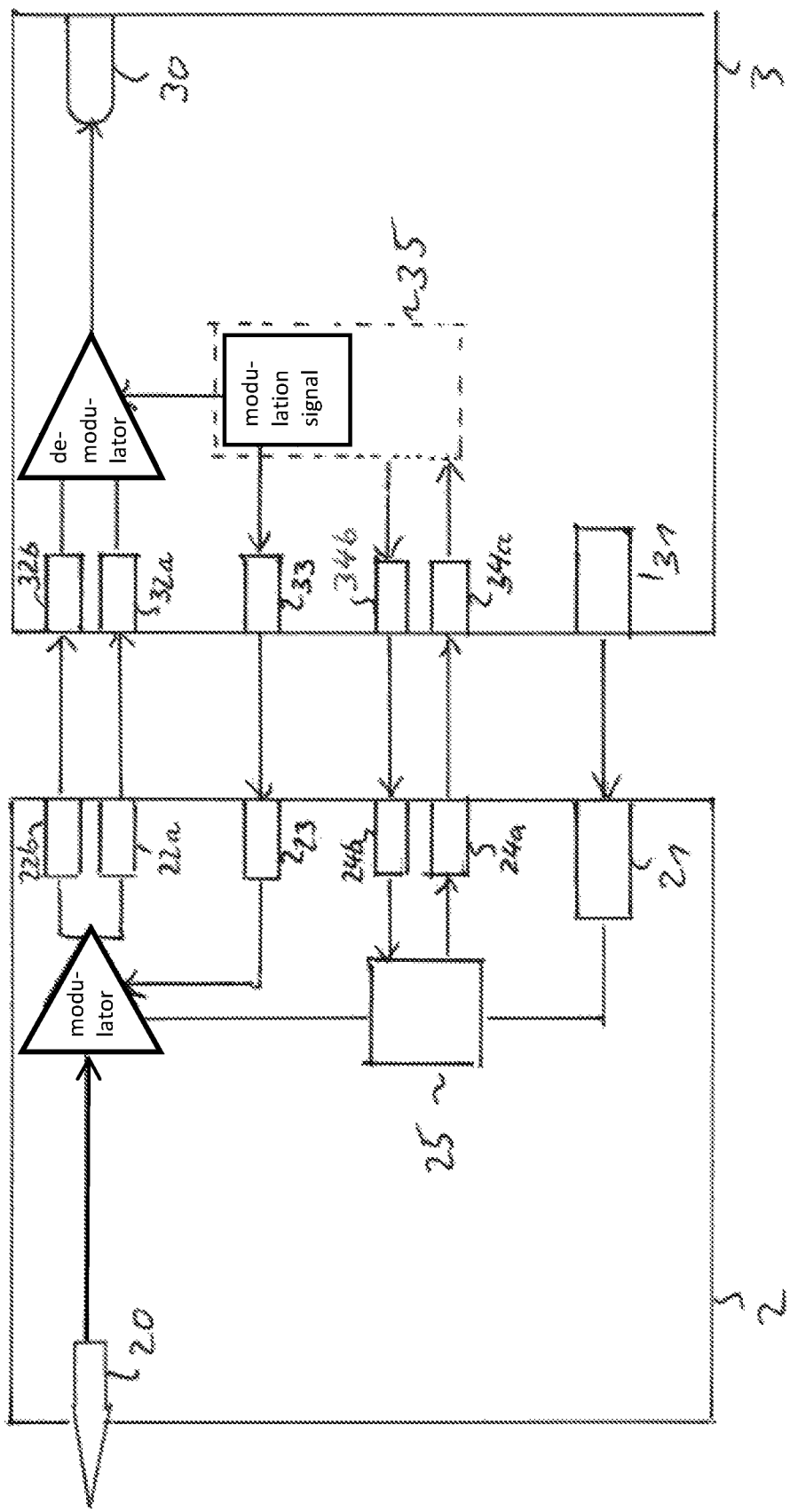
FIG. 3: shows a block diagram of a further probe arrangement with the probe head and the probe coupler according to an embodiment.

FIG. 3 shows a further embodiment of a probe arrangement 1. In particular, FIG. 3 shows a more detailed illustration of a probe arrangement 1, wherein the explanation of FIGS. 1 and 2 also applies to the configuration according to FIG. 3.

As can be further seen in FIG. 3, the operation of probe coupler 3 may be controlled by a control device 35. In particular, control device 35 may provide control signals, which are transmitted via an optical communication link to probe head 2. Furthermore, the above-mentioned modulation signal may be generated, for example by control device 35 and provided to probe head 2 via the third optical interfaces. Furthermore, the respective modulation signals may be also used in the probe coupler 3 for demodulating the received modulated optical signals.

Accordingly, the operation in probe head 2 may be also controlled by a control device 25. Control device 25 may receive control signals from probe coupler 3. Accordingly, the configuration of probe head 2 may be set on the received control data. In particular, control device 25 of probe head 2 and the further elements such as the optical interfaces 22a, 22b may be powered based on electrical power provided by the first optical interface 21. Accordingly, first optical interface 31 has to provide an optical power signal having sufficient power for powering probe head 2. For this purpose, at least 500 Milliwatt may be received by the first interface 21 and provided as power supply. Preferably, at least 1 Watt, 2 Watt or 5 Watt or more may be received by first interface 21 of the probe head or provided by the first interface 21 of the probe coupler 3.

The optical signals, in particular the optical power signal provided by the first interface 31 of probe head 3 may be generated by laser diodes. In order to provide an optical signal having sufficient power, it may be impossible to use more than one power diode in parallel.

The optical signals provided by the respective optical interfaces may provide, for example, optical signals having an amplitude modulated signal. However, any other kind of modulation may be possible, too.

Furthermore, a pilot signal may be also added to the optical transmission links. The pilot signal may be a modulated or unmodulated constant signal. The pilot signal may be monitored by the receiving end of the respective interface. Based on the monitoring result of the pilot signal, an appropriate operation may be performed. For example, if it is detected that the pilot signal is lost, a further transmission of optical signals may be stopped. Furthermore, a variation of the signal strength may be detected by monitoring the pilot signal. Accordingly, this variation may be taken into account when processing the received optical signals. In this way, compensation of effects such a temperature dependent effects or the like may be achieved.

Summarizing, the present invention relates to an electrically isolated acquisition of a measurement signal by means of a measurement probe. For this purpose, a probe arrangement is provided with a probe head for electrically measuring a signal. The probe head is coupled to a probe coupler via optical links. In particular, optical links are used for power supply of the probe head and for forwarding optical signals corresponding to the measured electrical signal. In further examples, multiple optical transmission channels may be used for transmitting signals corresponding to the measured electrical signal, wherein each transmission channel relates to a predetermined frequency range.

By providing an electrically isolated decision of a measurement signal, it is possible to measure electrical signals even with a high reference potential. In this way, a precise measurement of signals having a low amplitude with respect to a high reference potential can be measured precisely.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 1 probe arrangement
2 probe head
3 probe coupler
20 probe tip
21 first interface
22a, 22b second interfaces
23 third interface
24a, 24b fourth interfaces
25 controller
30 output port
31 first interface
32a, 32b second interfaces
33 third interface
34a, 34b fourth interfaces
35 controller
41, 42a, 42b optical links
100 device under test
200 measurement device

The invention claimed is:

1. A probe head for an electrically isolated acquisition of a measurement signal, the probe head comprises:
   a probe tip for receiving an electrical measurement signal;
   a first optical interface for receiving an optical power signal from a first interface of a probe coupler and converting the received optical power signal to electrical power, wherein the electrical power is used for a power supply of the probe head; and
   a number of one or more second optical interfaces, wherein each of the second optical interfaces is configured to transmitting an optical signal to one or more second interfaces of the probe coupler based on the electrical measurement signal received by said probe tip.

2. The probe head of claim 1, wherein each second optical interface is configured to transmit a signal relating to an individual predetermined bandwidth.

3. The probe head of claim 2, wherein the probe head comprises at least two second optical interfaces, and wherein the at least two second optical interfaces are configured to transmit signals of adjacent or overlapping bandwidths.

4. The probe head of claim 1, wherein the probe head comprising a third optical interface for receiving an optical modulation signal from a third interface of the probe coupler, wherein at least one of the number of second interfaces is configured to transmit a modulated optical signal based on the received modulation signal.

5. The probe head of claim 1, wherein the probe head comprising a fourth optical interface for receiving an optical control signal from a fourth interface of the probe coupler and/or transmitting an optical control signal to the fourth interface of the probe coupler;
wherein a configuration of the probe head is controlled based on the received and/or transmitted optical control signals.

6. A probe coupler for an electrically isolated acquisition of a measurement signal, the probe coupler comprising:
a first optical interface for transmitting an optical power signal to first interface of a probe head for power supply of the probe head;
a number of one or more second optical interfaces, wherein each of the second optical interfaces is configured to receive an optical signal from a corresponding second interface of the probe head, each received optical signal is based on an electrical measurement signal measured by the probe head; and
an output port for providing an electrical output signal based on the one or more optical signals received by the number of one or more second optical interfaces.

7. The probe coupler of claim 6, wherein the first optical interface comprises a laser diode.

8. The probe coupler of claim 6, wherein the first optical interface is configured to transmit power of at least 500 Milliwatt.

9. The probe coupler of claim 6, comprising a third optical interface for transmitting an optical modulation signal to a third interface of the probe head, wherein at least one of the number of second interfaces is configured to receive a modulated optical signal based on the transmitted modulation signal.

10. The probe coupler of claim 6, comprising a fourth optical interface for transmitting an optical control signal to a fourth interface of the probe head and/or receiving an optical control signal from the fourth interface of the probe head;
wherein a configuration of the probe head is controlled based on the received and/or transmitted optical control signals.

11. A probe arrangement for an electrically isolated acquisition of a measurement signal, the probe arrangement comprising:
a probe tip arranged in a probe head, the probe tip is configured to measure an electrical measurement signal;
a first optical transmission element for transmitting an optical power signal from a probe coupler to a probe head and converting the optical power signal in the probe head to electrical power, wherein the electrical power is used for a power supply of the probe head;
a number of one or more second optical transmission element, wherein each of the second optical transmission elements is configured to transmitting an optical signal from the probe head to the probe coupler, and wherein the optical signal of each second optical transmission element is based on the electrical measurement signal received by said probe tip; and
an output port arranged in the probe coupler, said output port is configured to provide an electrical output signal based on the one or more optical signals transmitted by the number of one or more second optical transmission elements from the probe head to the probe coupler.

12. The probe arrangement of claim 11, wherein the probe arrangement comprises at least two second optical transmission elements, and where the at least two second optical transmission elements are configured to transmit signals of adjacent or overlapping bandwidth.

13. The probe arrangement of claim 11, comprising a third optical transmission element for transmitting an optical modulation signal from the probe coupler to the probe head, wherein at least one of the number of second transmission elements is configured to transmit a modulated optical signal based on the received modulation signal.

14. The probe arrangement of claim 11, comprising a fourth optical transmission elements for transmitting control signals between the probe coupler and the probe head;
wherein a configuration of the probe head is controlled based on the transmitted optical control signals.

15. The probe arrangement of claim 11, wherein the first optical transmission element is configured to transmit power of at least 500 Milliwatt.

16. The probe arrangement of claim 11, wherein the optical transmission elements comprise laser diode for emitting optical signals.

17. The probe arrangement of claim 16, wherein at least one laser diode is configured to emit an amplitude modulated signal.

18. The probe arrangement of claim 16, wherein the at least one laser diode is configured to transmit a pilot signal, and a receiving interface of a corresponding optical interface in the probe head is configured to monitor the pilot signal.

19. The probe arrangement of claim 11, comprising one or more optical fibers for optically coupling the probe head and the probe coupler.

20. The probe arrangement of claim 11, wherein each of the first optical transmission element and the one or more second optical transmission elements comprises an optical interface for emitting an optical signal, a further optical interface for receiving the emitted optical signal and an optical transmission link for forwarding the emitted optical signal form the optical interface to the further optical interface.

* * * * *